United States Patent
Tseng et al.

(10) Patent No.: US 12,020,747 B2
(45) Date of Patent: Jun. 25, 2024

(54) NON-VOLATILE MEMORY AND PROGRAMMING METHOD THEREOF

(71) Applicant: MACRONIX INTERNATIONAL CO., LTD., Hsinchu (TW)

(72) Inventors: Po-Hao Tseng, Taichung (TW);
Feng-Min Lee, Hsinchu (TW);
Yung-Chun Li, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 169 days.

(21) Appl. No.: 17/511,802

(22) Filed: Oct. 27, 2021

(65) Prior Publication Data

US 2023/0027384 A1    Jan. 26, 2023

Related U.S. Application Data (60) Provisional application No. 63/223,552, filed on Jul. 20, 2021.

(51) Int. Cl.
| | | |
|---|---|---|
| *G11C 11/00* | (2006.01) | |
| *G11C 11/56* | (2006.01) | |
| *G11C 16/10* | (2006.01) | |

(52) U.S. Cl.
CPC ...... *G11C 11/5628* (2013.01); *G11C 11/5671* (2013.01); *G11C 16/10* (2013.01)

(58) Field of Classification Search
CPC .. G11C 11/5628; G11C 11/5671; G11C 16/10
See application file for complete search history.

(56) References Cited

U.S. PATENT DOCUMENTS

| | | | |
|---|---|---|---|
| 8,208,310 B2 | 6/2012 | Dong et al. | |
| 9,336,866 B2 | 5/2016 | Kwak et al. | |
| 2009/0010068 A1 | 1/2009 | Lee | |
| 2010/0002515 A1* | 1/2010 | Lutze | G11C 16/3404 |
| | | | 365/185.17 |
| 2014/0016415 A1* | 1/2014 | Kamei | G11C 11/5628 |
| | | | 365/185.18 |
| 2017/0148526 A1* | 5/2017 | Li | G11C 11/5642 |
| 2022/0342585 A1* | 10/2022 | Sharma | G06F 3/0679 |

FOREIGN PATENT DOCUMENTS

| | | |
|---|---|---|
| CN | 104282337 A | 1/2015 |
| CN | 112599157 A | 4/2021 |
| TW | 201203259 A | 1/2012 |

* cited by examiner

*Primary Examiner* — Uyen Smet
(74) *Attorney, Agent, or Firm* — McClure, Qualey & Rodack, LLP (57) ABSTRACT

A non-volatile memory and a programming method thereof are provided. The programming method of the non-volatile memory includes the following steps. A coarse programming procedure is performed for programing all of a plurality of memory cells at an erase state to $2^N-1$ or $2^N$ program states. N is a positive integer. A fine programming procedure is performed for pushing all of memory cells into $2^N-1$ or $2^N$ verify levels.

20 Claims, 9 Drawing Sheets

NON-VOLATILE MEMORY AND PROGRAMMING METHOD THEREOF

This application claims the benefit of U.S. provisional application Ser. No. 63/223,552, filed Jul. 20, 2021, the subject matter of which is incorporated herein by reference.

TECHNICAL FIELD

The disclosure relates in general to a memory and an operation method thereof, and more particularly to a non-volatile memory and a programming method thereof.

BACKGROUND

Along with the development of the memory technology, the storage density of the memory is increased. Traditionally, an error correcting code (ECC) circuit is required to correct errors in the memory for ensuring data integrity. The reliability of data is usually degraded after long data retention time and high program and erase (P/E) cycles.

Along with the bits increasing, a strong ECC circuit is required. However, the ECC circuit will degrade the memory performance including area consumption and longer decoding latency. For improving area utilization and speeding up the decoding speed, researchers are working on developing a memory without the ECC circuit or a memory with smaller ECC circuit.

SUMMARY

The disclosure is directed to a non-volatile memory and a programming method thereof. During a programming method of the non-volatile memory, an erase state is removed. Therefore, the bit error occurred between an erase state and a first program state is greatly reduced, therefore the ECC circuit is no need or can be smaller.

According to one embodiment, a programming method of a non-volatile memory is provided. The programming method of the non-volatile memory includes the following steps. A coarse programming procedure is performed for programing all of a plurality of memory cells at an erase state to $2^N-1$ or $2^N$ program states. N is a positive integer. A fine programming procedure is performed for pushing all of memory cells into $2^N-1$ or $2^N$ verify levels.

According to another embodiment, a non-volatile memory is provided. The non-volatile memory includes a memory array and a controller. The memory array includes a plurality of memory cells. The controller is configured to perform a coarse programming procedure for programing all of the memory cells at an erase state to $2^N-1$ or $2^N$ program states; and perform a fine programming procedure for pushing all of memory cells into $2^N-1$ or $2^N$ verify levels. N is a positive integer.

According to an alternative embodiment, a programming method of a non-volatile memory is provided. The programming method of the non-volatile memory includes the following steps. A coarse programming procedure is performed for programing each of a plurality of memory cells at an erase state to one of $2^N-1$ or $2^N$ program states. N is a positive integer. A fine programming procedure is performed for pushing each of memory cells into one of $2^N-1$ or $2^N$ verify levels.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
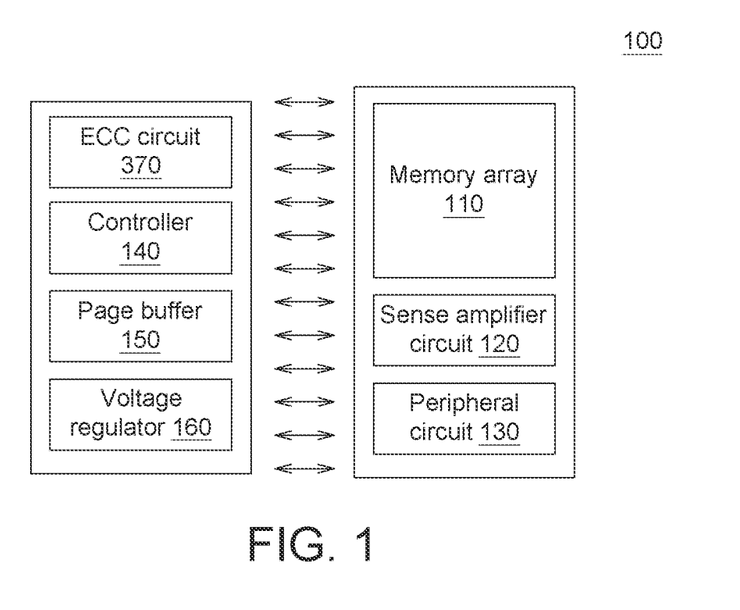
FIG. 1 shows a block diagram of a non-volatile memory according to one embodiment.

Please refer to FIG. 1, which shows a block diagram of a non-volatile memory 100 according to one embodiment. The non-volatile memory 100 is, for example, a NAND flash memory, a NOR flash memory, a floating gate memory or a SONOS memory. The non-volatile memory 100 may be a Multi-Level Cell (MLC) memory, a Triple-Level Cell (TLC) memory, a Quad-Level Cell (QLC) memory or a Penta-Level Cell (PLC) memory. Moreover, the non-volatile memory 100 may be a 2D flash memory or a 3D flash memory.

The non-volatile memory 100 includes, for example, a memory array 110, a sense amplifier circuit 120, a peripheral circuit 130, a controller 140, a page buffer 150, a voltage regulator 160 and an ECC circuit 170. The memory array 110 includes a plurality of memory cells. The sense amplifier circuit 120 is used to sense the low power signals from a bit line that represents a data bit (1 or 0) stored in one memory cell, and amplify the small voltage, so the data can be interpreted properly. The controller 140 is used to control circuits to perform the programming method, the reading method and the erasing method. The page buffer 150 is used to temporarily save data. The voltage regulator 160 is used to provide an appropriate supply voltage.

Figure 2A:
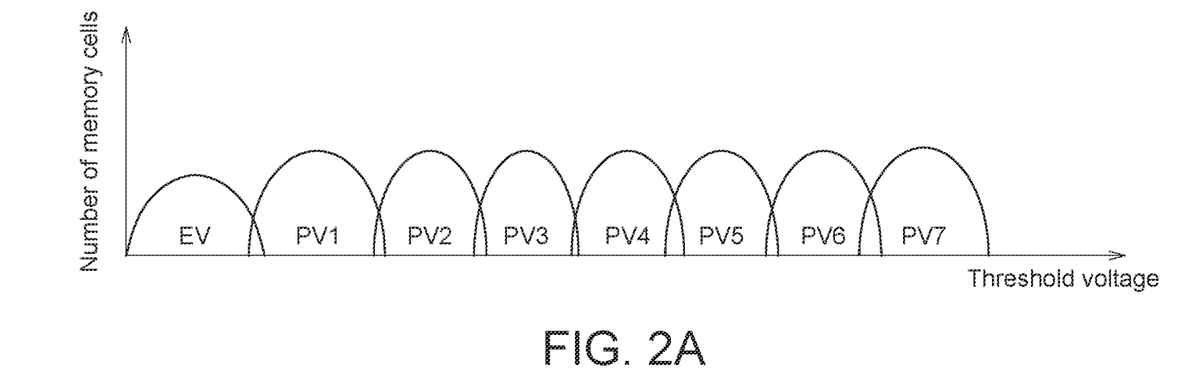
FIG. 2A illustrates one example of a threshold voltage distribution of the non-volatile memory after performing a coarse programming procedure.
Figure 2B:
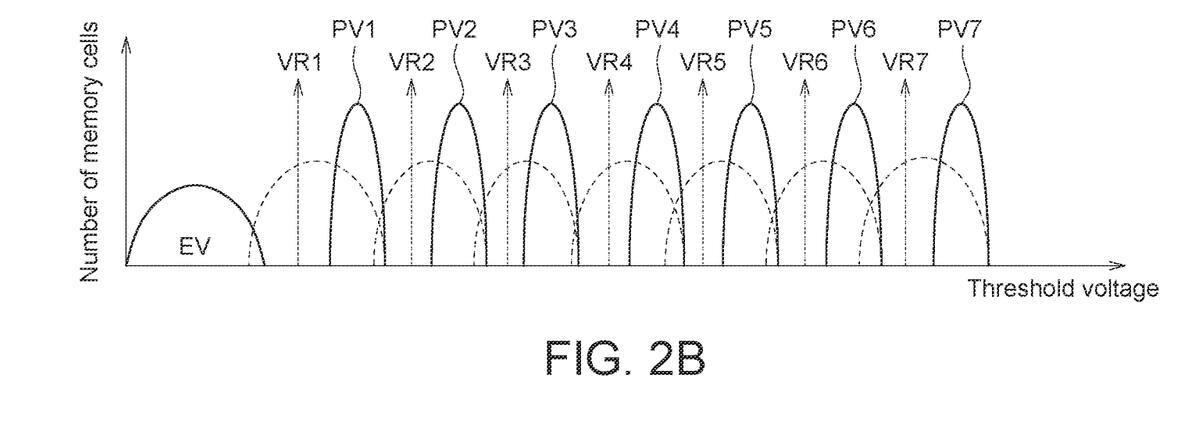
FIG. 2B illustrates one example of a threshold voltage distribution of the non-volatile memory after performing a fine programming procedure.

A programming method of a non-volatile memory includes a coarse programming procedure and a fine programming procedure. Please refer to FIGS. 2A to 2B. FIG. 2A illustrates one example of a threshold voltage distribution of the non-volatile memory after performing the coarse programming procedure. FIG. 2B illustrates one example of a threshold voltage distribution of the non-volatile memory after performing the fine programming procedure. In FIGS. 2A and 2B, the non-volatile memory is, for example, a Triple-Level Cell (TLC) 3D NAND flash memory.

As shown in FIG. 2A, during the coarse programming procedure, some of a plurality of memory cells are programed to program states PV1 to PV7, and some of the memory cells are remained at an erase state EV. In the coarse programming procedure, the step voltage is large since it only needs to roughly categorize the memory cells into several groups.

As shown in FIG. 2B, during the fine programming procedure, the memory cells are programmed with small step voltage to carefully push the memory cells forward into the verify levels VR1 to VR7. Therefore, the memory cells at 8 states including the erase state EV and the program states PV1 to PV7 are used for data storage.

Figure 3:
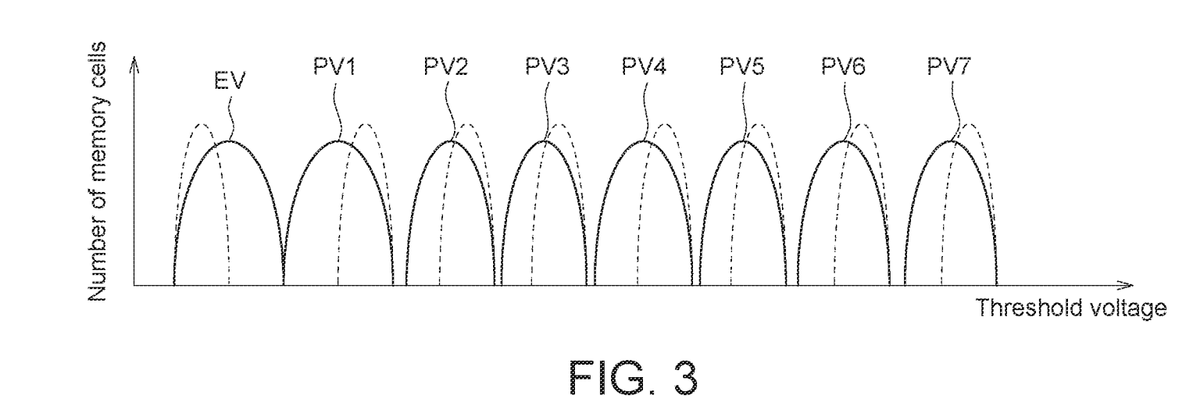
FIG. 3 illustrates a threshold voltage distribution of the non-volatile memory of FIG. 2B after baking, long data retention time or high program and erase (P/E) cycles.

Please refer to FIG. 3, which illustrates a threshold voltage distribution of the non-volatile memory of FIG. 2B after baking, long data retention time or high program and erase (P/E) cycles. After baking, long data retention time or high program and erase (P/E) cycles, the erase state EV will cause charge gain and therefore shift right. On the contrary, the distribution of the program states PV1 to PV7 will be shifted left. Therefore, the ECC circuit 170 is needed to cover the high bit error rate that is occurred due to the overlap between the erase state EV and the program state PV1.

Figure 4:
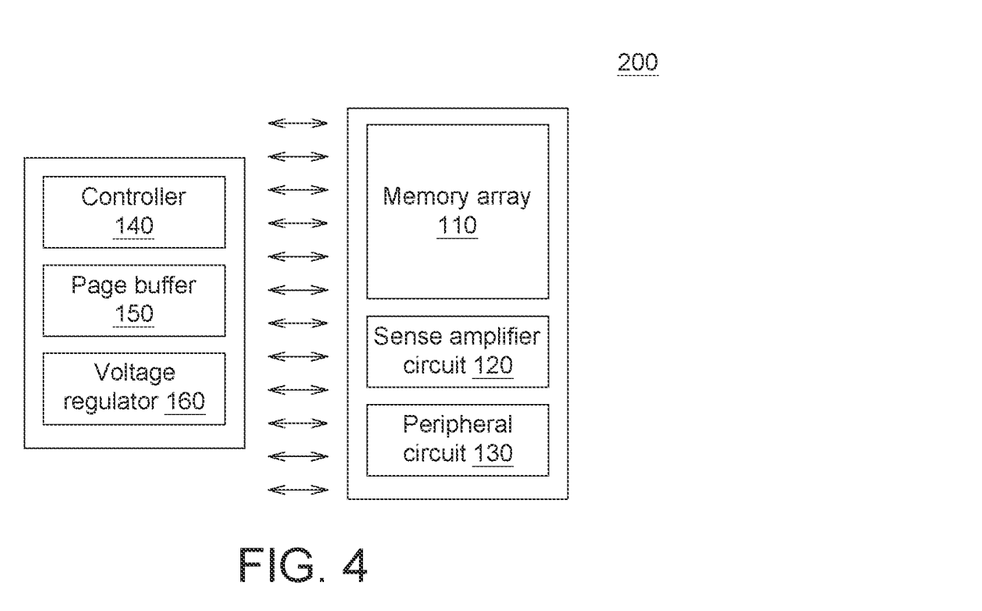
FIG. 4 shows a block diagram of a non-volatile memory according to another embodiment.

Please refer to FIG. 4, which shows a block diagram of a non-volatile memory 200 according to another embodiment. In this embodiment, the controller 140 removes the erase state EV during the programming method, so the bit error occurred between the erase state EV and the program state PV1 is greatly reduced, therefore the ECC circuit 170 is no need or can be smaller. The operation of the controller 140 is illustrated via a flowchart.

Figure 5:
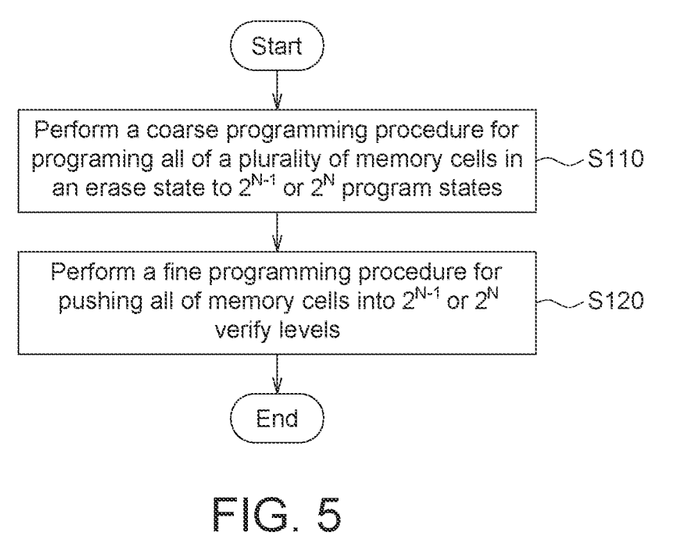
FIG. 5 shows a flowchart of a programming method of the non-volatile memory according to the embodiment of FIG. 4.
Figure 6A:
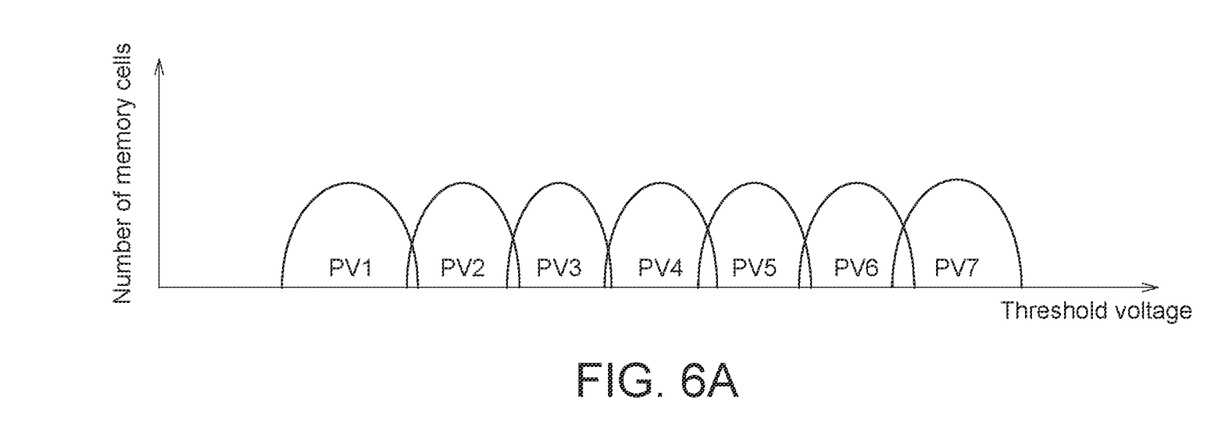
FIG. 6A illustrates a threshold voltage distribution of the non-volatile memory with $2^N-1$ program states in FIG. 5 after performing the coarse programming procedure (N is, for example, 3).
Figure 6B:
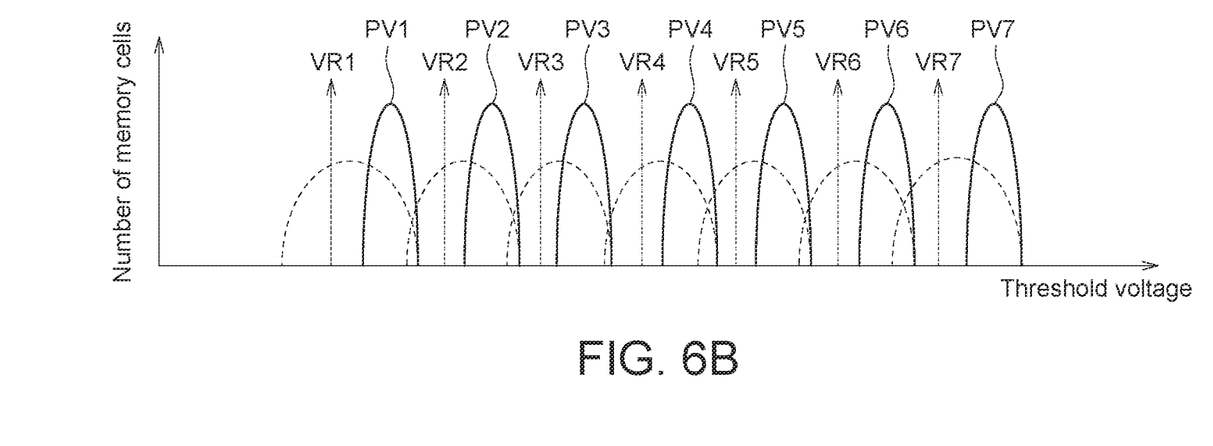
FIG. 6B illustrates a threshold voltage distribution of the non-volatile memory with $2^N-1$ program states in FIG. 5 after performing the fine programming procedure (N is, for example, 3).

Please refer to FIG. 5 to FIG. 6B. FIG. 5 shows a flowchart of a programming method of the non-volatile memory 200 according to the embodiment of FIG. 4. FIG. 6A illustrates a threshold voltage distribution of the non-volatile memory with 2^N−1 program state in FIG. 5 after performing the coarse programming procedure (N is, for example, 3). FIG. 6B illustrates a threshold voltage distribution of the non-volatile memory with 2^N−1 program states in FIG. 5 after performing the fine programming procedure (N is, for example, 3). The controller 140 is configured to at least perform the programming method.

In step S110, the controller 140 performs the coarse programming procedure for programing all of the memory cells at the erase state to 2^N−1 (or 2^N) program states. N is a positive integer and larger than 1. In the coarse programming procedure, the step voltage is large since it only needs to roughly categorize the memory cells into several groups. If the non-volatile memory is the MLC memory, N is 2; if the non-volatile memory is the TLC memory, N is 3; if the non-volatile memory is the QLC memory, N is 4; if the non-volatile memory is the PLC memory, N is 5.

As shown in FIG. 6A, the non-volatile memory 200 is the TLC memory and N is 3. For example, after performing the coarse programming procedure, all of the memory cells at the erase state EV can be programmed to 7 program states PV1 to PV7. Each of the 7 program states PV1 to PV7 is different from the erase state EV. The term "different" means that the threshold voltage of any of the program states PV1 to PV7 is not identical to the threshold voltage of the erase state EV. After performing the coarse programming procedure, none of the memory cells is at the erase state EV, and a quality of the memory cells which are at the erase state EV is 0.

Then, in step S120, the controller 140 performs the fine programming procedure for pushing all of memory cells into 2^N−1 (or 2^N) verify levels. As shown in FIG. 6B, all of the memory cells are programmed with small step voltage to carefully push the memory cells forward into the verify levels VR1 to VR7.

After performing the programming method, 2^N−1 (or 2^N) states program states are obtained. The memory cells at the program states are used for data storage. The erase state EV is removed and is not used for data storage. As shown in FIG. 6B, the memory cells at the program states PV1 to PV7 are used for data storage.

Figure 7:
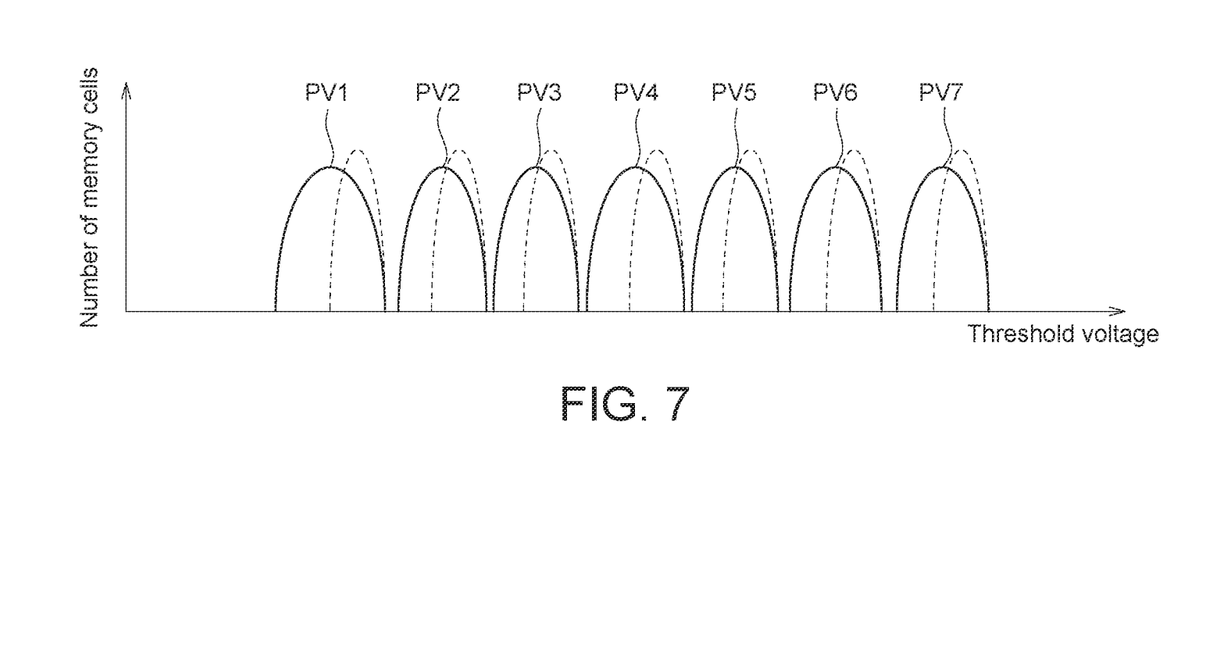
FIG. 7 illustrates a threshold voltage distribution of the non-volatile memory with $2^N-1$ program states in FIG. 6B after baking, long data retention time or high program and erase (P/E) cycles (N is, for example, 3).

Please refer to FIG. 7, which illustrates a threshold voltage distribution of the non-volatile memory with 2^N−1 program states in FIG. 6B after baking, long data retention time or high program and erase (P/E) cycles (N is, for example, 3). After baking, long data retention time or high program and erase (P/E) cycles, the program states PV1 to PV7 will be shifted left. Because the erase state EV is removed during the programming method, so the bit error occurred on the overlap between the erase state EV and the program state PV1 is greatly reduced, therefore the ECC circuit is no need, as shown in FIG. 4.

Figure 8A:
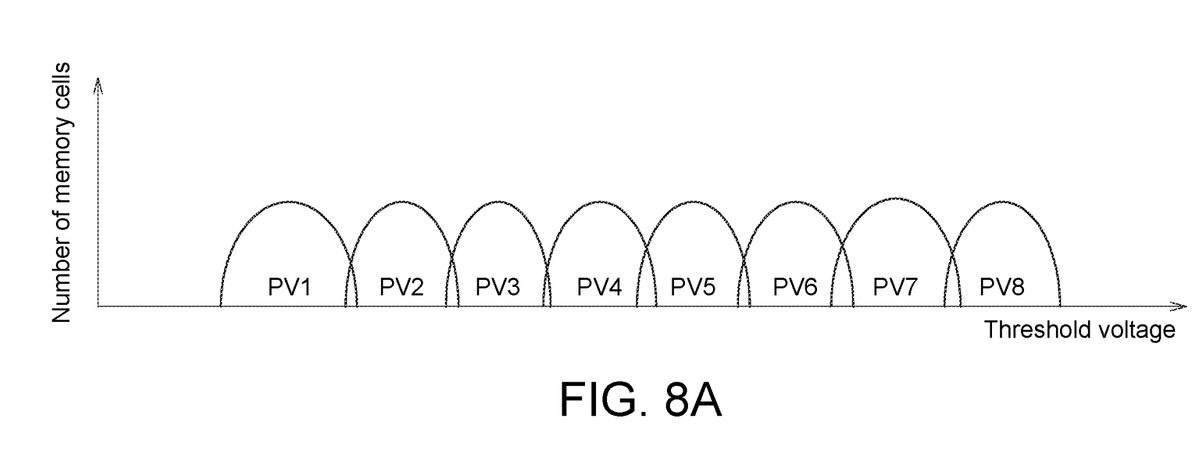
FIG. 8A illustrates a threshold voltage distribution of the non-volatile memory with $2^N$ program states in FIG. 5 after performing the coarse programming procedure (N is, for example, 3).
Figure 8B:
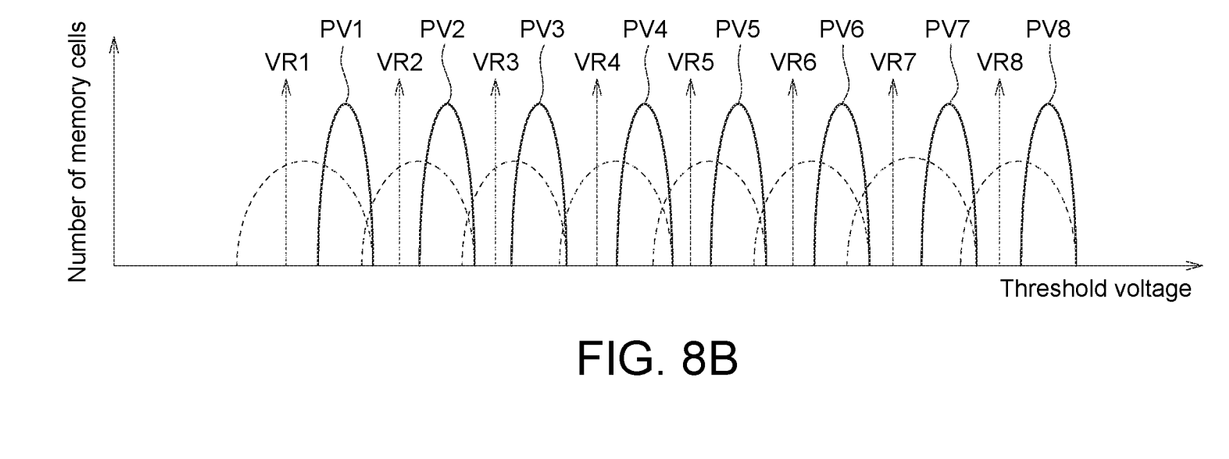
FIG. 8B illustrates a threshold voltage distribution of the non-volatile memory with $2^N$ program states in FIG. 5 after performing the fine programming procedure (N is, for example, 3).
Figure 9:
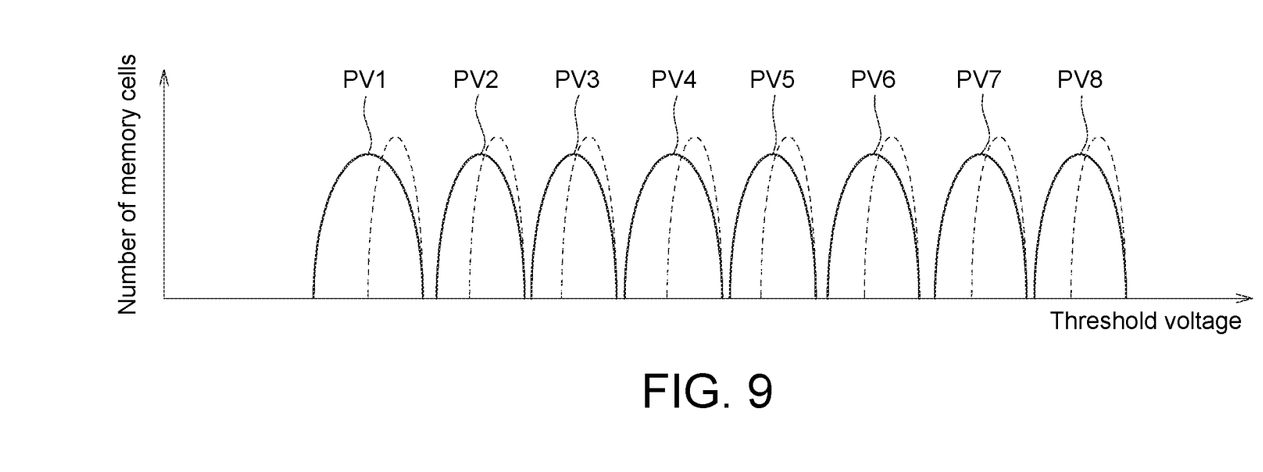
FIG. 9 illustrates a threshold voltage distribution of the non-volatile memory with $2^N$ program states in FIG. 8B after baking, long data retention time or high program and erase (P/E) cycles (N is, for example, 3).

FIG. 6A to 7 illustrate an example with 2^N−1 program states (N is, for example, 3). Please further refer to FIG. 8A to 9. FIG. 8A illustrates a threshold voltage distribution of the non-volatile memory with 2^N program states in FIG. 5 after performing the coarse programming procedure (N is, for example, 3). FIG. 8B illustrates a threshold voltage distribution of the non-volatile memory with 2^N program states in FIG. 5 after performing the fine programming procedure (N is, for example, 3). FIG. 9 illustrates a threshold voltage distribution of the non-volatile memory with 2^N program states in FIG. 8B after baking, long data retention time or high program and erase (P/E) cycles (N is, for example, 3).

As shown in FIG. 8A, after performing the coarse programming procedure, all of the memory cells at the erase state EV are programmed to 8 program states PV1 to PV8. Each of the 8 program states PV1 to PV8 is different from the erase state EV. The term "different" means that the threshold voltage of any of the program states PV1 to PV7 is not identical to the threshold voltage of the erase state EV. After performing the coarse programming procedure, none of the memory cells is at the erase state EV, and a quality of the memory cells which are at the erase state EV is 0.

As shown in FIG. 8B, all of the memory cells are programmed with small step voltage to carefully push the memory cells forward into the verify levels VR1 to VR8.

As shown in FIG. 9, because the erase state EV is removed during the programming method, so the bit error occurred on the overlap between the erase state EV and the program state PV1 is greatly reduced, therefore the ECC circuit is no need, as shown in FIG. 4.

Figure 10:
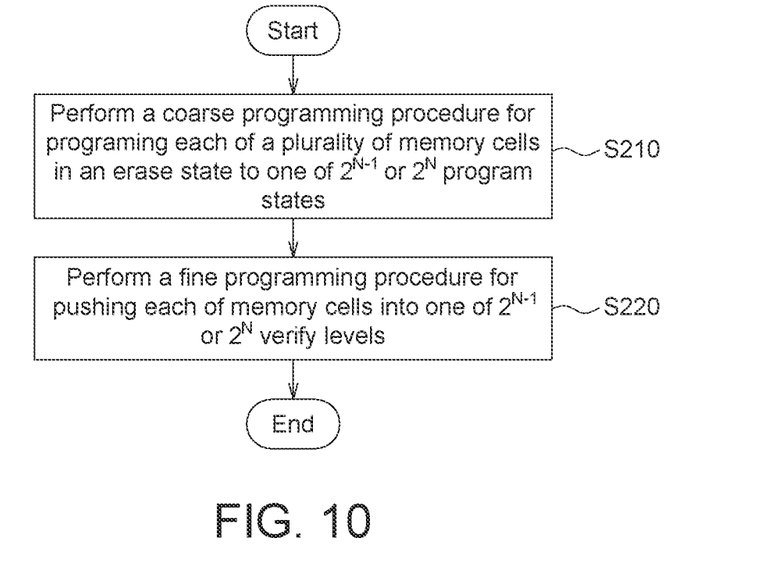
FIG. 10 shows a flowchart of a programming method of the non-volatile memory according to another embodiment.

Please referring to FIG. 10, shows a flowchart of a programming method of the non-volatile memory 200 according to another embodiment. In step S210, the controller 140 performs the coarse programming procedure for programing each of the memory cells at the erase state EV to one of 2^N-1 (or 2^N) program states, wherein N is a positive integer and larger than 1. In this embodiment, each of the memory cells is programmed to one program state. After performing the coarse programming procedure, the number of the program states used for the memory cells may be less than 2^N-1 (or 2^N). If the non-volatile memory is the MLC memory, N is 2; if the non-volatile memory is the TLC memory, N is 3; if the non-volatile memory is the QLC memory, N is 4; if the non-volatile memory is the PLC memory, N is 5. For example, if N is 3, the program states PV1 to PV7 can be used for the memory cells. In this step, each of the memory cells at the erase state EV will be programmed to one of the 7 program states PV1 to PV7. In one case, the program states PV1, PV3 to PV7 are used and the program PV2 is not used, so the number of the program states used for the memory cells may be less than 7 after performing the coarse programming procedure.

Then, in step S220, the controller 140 performs the fine programming procedure for pushing each of memory cells into one of 2^N-1 (or 2^N) verify levels. After performing the fine programming procedure, the number of the program states used for the memory cells may be less than 2^N-1 (or 2^N). In this step, each of the memory cells at the erase state EV will be programmed to one of the 7 program states PV1 to PV7. So, the number of the program states used for the memory cells may be less than 7 after performing the fine programming procedure.

On the other hand, if the non-volatile memory 200 is the QLC memory, N is 4. After performing the coarse programming procedure, all of the memory cells at the erase state EV are programmed to 15 (or 16) program states; or, each of the memory cells at the erase state EV is programmed to one of 15 (or 16) program states.

Moreover, if the non-volatile memory 200 is the PLC memory, N is 5. After performing the coarse programming procedure, all of the memory cells at the erase state EV are programmed to 31 (or 32) program states; or, each of the memory cells at the erase state EV is programmed to one of 31 (or 32) program states.

Base on above, the controller 140 removes the erase state EV during the programming method, so the bit error occurred between the erase state EV and the program state PV1 is greatly reduced, therefore the ECC circuit is no need or can be smaller.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A programming method of a non-volatile memory, comprising:
performing a coarse programming procedure for programing all of a plurality of memory cells at an erase state to 2^N-1 or 2^N program states, and removing the erase state, wherein N is a positive integer; and
performing a fine programming procedure for pushing all of the memory cells into 2^N-1 or 2^N verify levels,
wherein during the coarse programming procedure, a larger step voltage is configured to categorize the memory cells into several groups,
wherein during the fine programming procedure, the memory cells are programmed with a smaller step voltage to push all of the memory cells forward into the verify levels,
wherein removing the erase state comprises:
determining an overlap between the erase state and a first program state of the 2^N-1 or 2^N program states; and
removing the overlap between the erase state and the first program state.

2. The programming method of the non-volatile memory according to claim 1, wherein after performing the coarse programming procedure, a quality of the memory cells which are at the erase state is 0.

3. The programming method of the non-volatile memory according to claim 1, wherein a threshold voltage of each of the program states is different from a threshold voltage of the erase state.

4. The programming method of the non-volatile memory according to claim 1, wherein
if the non-volatile memory is a Multi-Level Cell (MLC) memory, N is 2, after performing the coarse programming procedure, all of the memory cells at the erase state are programmed to 3 or 4 program states;
if the non-volatile memory is a Triple-Level Cell (TLC) memory, N is 3, after performing the coarse programming procedure, all of the memory cells at the erase state are programmed to 7 or 8 program states;
if the non-volatile memory is a Quad-Level Cell (QLC) memory, N is 4, after performing the coarse programming procedure, all of the memory cells at the erase state are programmed to 15 or 16 program states; and
if the non-volatile memory is a Penta-Level Cell (PLC) memory, N is 5, after performing the coarse programming procedure, all of the memory cells at the erase state are programmed to 31 or 32 program states.

5. The programming method of the non-volatile memory according to claim 1, wherein after performing the coarse programming procedure, the memory cells at the program states are used for data storage.

6. The programming method of the non-volatile memory according to claim 1, wherein after performing the coarse programming procedure, all of the memory cells are at the program states.

7. The programming method of the non-volatile memory according to claim 1, wherein N is larger than 1.

8. A non-volatile memory, comprising:
a memory array, including a plurality of memory cells; and
a controller, configured to
perform a coarse programming procedure for programing all of the memory cells at an erase state to 2^N-1 or 2^N program states, and remove the erase state, wherein N is a positive integer; and
perform a fine programming procedure for pushing all of the memory cells into 2^N-1 or 2^N verify levels,
wherein during the coarse programming procedure, a larger step voltage is configured to categorize the memory cells into several groups,
wherein during the fine programming procedure, the memory cells are programmed with a smaller step voltage to push all of the memory cells forward into the verify levels, wherein the controller is configured to remove the erase state by:
  determining an overlap between the erase state and a first program state of the 2^N−1 or 2^N program states; and
  removing the overlap between the erase state and the first program state.

9. The non-volatile memory according to claim 8, wherein after performing the coarse programming procedure, a quality of the memory cells which are at the erase state is 0.

10. The non-volatile memory according to claim 8, wherein a threshold voltage of each of the program states is different from a threshold voltage of the erase state.

11. The non-volatile memory according to claim 8, wherein
  if the non-volatile memory is a Multi-Level Cell (MLC) memory, N is 2, after performing the coarse programming procedure, all of the memory cells at the erase state are programmed to 3 or 4 program states;
  if the non-volatile memory is a Triple-Level Cell (TLC) memory, N is 3, after performing the coarse programming procedure, all of the memory cells at the erase state are programmed to 7 or 8 program states;
  if the non-volatile memory is a Quad-Level Cell (QLC) memory, N is 4, after performing the coarse programming procedure, all of the memory cells at the erase state are programmed to 15 or 16 program states; and
  if the non-volatile memory is a Penta-Level Cell (PLC) memory, N is 5, after performing the coarse programming procedure, all of the memory cells at the erase state are programmed to 31 or 32 program states.

12. The non-volatile memory according to claim 8, wherein after performing the coarse programming procedure, the memory cells at the program states are used for data storage.

13. The non-volatile memory according to claim 8, after performing the coarse programming procedure, all of the memory cells are at the program states.

14. The non-volatile memory according to claim 8, wherein N is larger than 1.

15. A programming method of a non-volatile memory, comprising:
  performing a coarse programming procedure for programing each of a plurality of memory cells at an erase state to one of 2^N−1 or 2^N program states, and removing the erase state, wherein N is a positive integer; and
  performing a fine programming procedure for pushing each of the memory cells into one of 2^N−1 or 2^N verify levels,
  wherein during the coarse programming procedure, a lager larger step voltage is configured to categorize the memory cells into several groups,
  wherein during the fine programming procedure, the memory cells are programmed with a smaller step voltage to push all of the memory cells forward into the verify levels,
  wherein removing the erase state comprises:
    determining an overlap between the erase state and a first program state of the 2^N−1 or 2^N program states; and
    removing the overlap between the erase state and the first program state.

16. The programming method of the non-volatile memory according to claim 15, wherein after performing the coarse programming procedure, a quality of the memory cells which are at the erase state is 0.

17. The programming method of the non-volatile memory according to claim 15, wherein a threshold voltage of each of the program states is different from a threshold voltage of the erase state.

18. The programming method of the non-volatile memory according to claim 15, wherein
  if the non-volatile memory is a Multi-Level Cell (MLC) memory, N is 2, after performing the coarse programming procedure, each of the memory cells at the erase state is programmed to one of 3 or 4 program states;
  if the non-volatile memory is a Triple-Level Cell (TLC) memory, N is 3, after performing the coarse programming procedure, each of the memory cells at the erase state is programmed to one of 7 or 8 program states;
  if the non-volatile memory is a Quad-Level Cell (QLC) memory, N is 4, after performing the coarse programming procedure, each of the memory cells at the erase state is programmed to one of 15 or 16 program states; and
  if the non-volatile memory is a Penta-Level Cell (PLC) memory, N is 5, after performing the coarse programming procedure, each of the memory cells at the erase state is programmed to one of 31 or 32 program states.

19. The programming method of the non-volatile memory according to claim 15, wherein after performing the coarse programming procedure, the memory cells at the program state are used for data storage.

20. The programming method of the non-volatile memory according to claim 15, after performing the coarse programming procedure, all of the memory cells are at the program states.

* * * * *